US012562340B2

(12) United States Patent
Kaneko et al.

(10) Patent No.: US 12,562,340 B2
(45) Date of Patent: Feb. 24, 2026

(54) FILM FORMING METHOD AND FILM FORMING APPARATUS

(71) Applicant: Tokyo Electron Limited, Tokyo (JP)

(72) Inventors: Miyako Kaneko, Nirasaki (JP);
Takashi Hashizume, Nirasaki (JP);
Naoko Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 433 days.

(21) Appl. No.: 18/007,318

(22) PCT Filed: Jul. 20, 2021

(86) PCT No.: PCT/JP2021/027072
§ 371 (c)(1),
(2) Date: Jan. 30, 2023

(87) PCT Pub. No.: WO2022/024859
PCT Pub. Date: Feb. 3, 2022

(65) Prior Publication Data
US 2023/0326719 A1     Oct. 12, 2023

(30) Foreign Application Priority Data

Jul. 31, 2020     (JP) ................................. 2020-130444

(51) Int. Cl.
*H01L 21/02*          (2006.01)
*H01J 37/32*          (2006.01)

(52) U.S. Cl.
CPC .. *H01J 37/32165* (2013.01); *H01J 37/32449* (2013.01); *H01J 37/32816* (2013.01); *H01L*

*21/0217* (2013.01); *H01L 21/02274* (2013.01); *H01J 2237/332* (2013.01)

(58) Field of Classification Search
None
See application file for complete search history.

(56) References Cited

U.S. PATENT DOCUMENTS

2003/0049558 A1* 3/2003 Aoki ................. H01J 37/32183
430/128
2021/0257213 A1* 8/2021 Kikuchi ............ H01L 21/02118

FOREIGN PATENT DOCUMENTS

JP          2003-092200 A          3/2003
JP          2020-065032 A          4/2020

* cited by examiner

*Primary Examiner* — Asok K Sarkar
(74) *Attorney, Agent, or Firm* — Armstrong Teasdale LLP

(57) ABSTRACT

A film forming method includes: a supply operation of supplying a processing gas into a processing container in which a substrate is accommodated, the processing gas including a silicon-containing gas, a nitrogen-containing gas, and a diluent gas; and a film forming operation of plasmarizing the processing gas by supplying, into the processing container, power obtained by phase-controlling and superimposing first power with a first frequency in a VHF band and second power with a second frequency different from the first frequency in the VHF band, and forming a silicon nitride film on the substrate by the plasmarized processing gas.

13 Claims, 8 Drawing Sheets

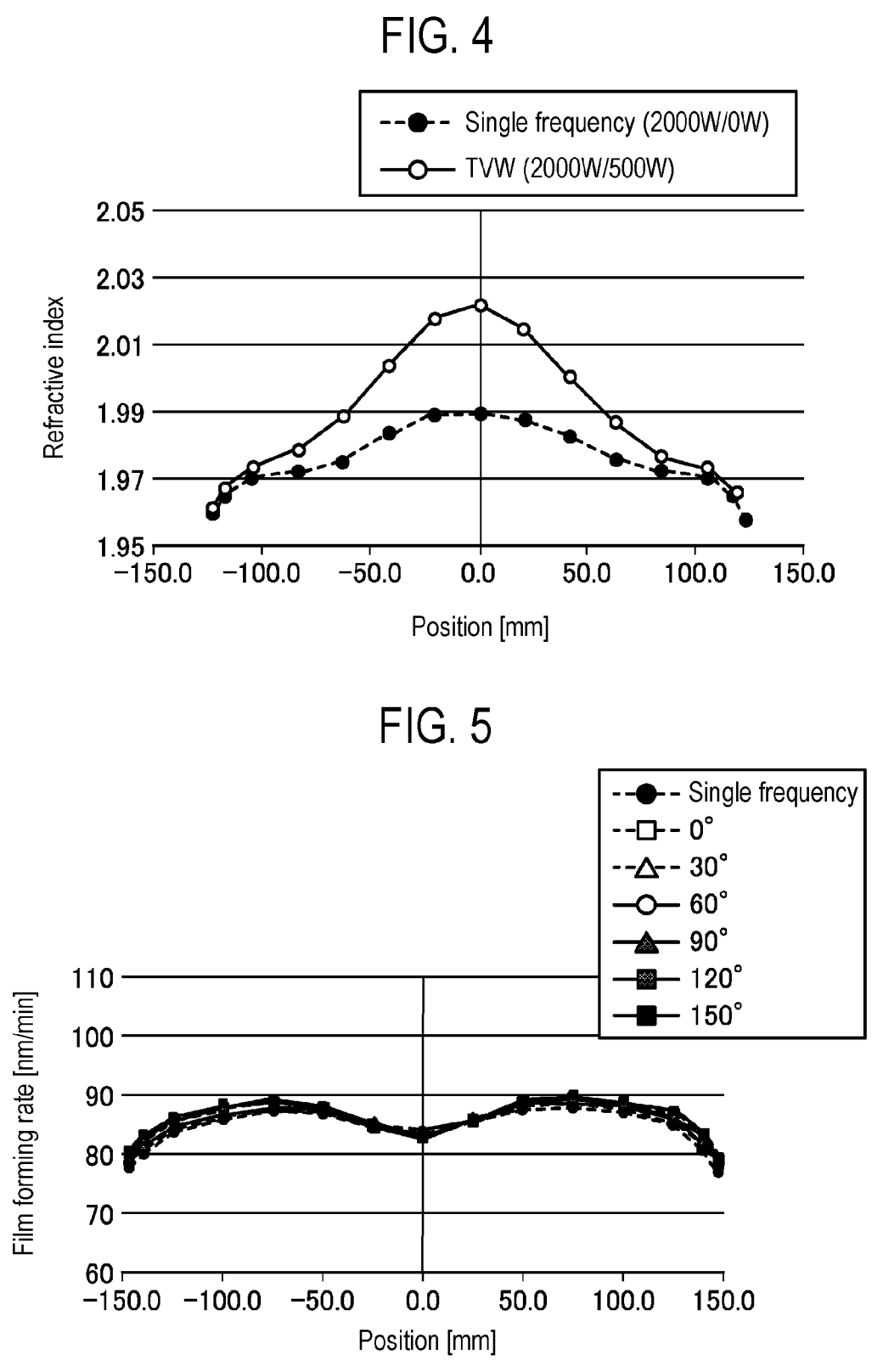

Legend:
- - ●- - Single frequency (2000W/0W)
- —○— TVW (2000W/500W)

Y-axis: Refractive index (2.05, 2.03, 2.01, 1.99, 1.97, 1.95)

X-axis: Position [mm] (−150.0, −100.0, −50.0, 0.0, 50.0, 100.0, 150.0)

FIG. 5

Legend:
- - ●- - Single frequency
- -□- - 0°
- -△- - 30°
- —○— 60°
- —▲— 90°
- —▣— 120°
- —■— 150°

Y-axis: Film forming rate [nm/min] (110, 100, 90, 80, 70, 60)

X-axis: Position [mm] (−150.0, −100.0, −50.0, 0.0, 50.0, 100.0, 150.0)

FIG. 14

FILM FORMING METHOD AND FILM FORMING APPARATUS

CROSS-REFERENCE TO RELATED APPLICATIONS

The present application is a U.S. National Stage Entry of International Patent Application No. PCT/JP2021/027072, filed Jul. 20, 2021, which claims the benefit of priority to Japanese Patent Application No. 2020-130444, filed Jul. 31, 2020, each of which is hereby incorporated herein by reference in its entirety.

TECHNICAL FIELD

The present disclosure relates to a film forming method and a film forming apparatus.

BACKGROUND

Patent Document 1 discloses a technique for forming a silicon nitride film by plasmarizing a processing gas including a silane gas, an ammonia gas, and a noble gas using radio frequency power having a frequency of 300 kHz to 5 MHz.

PRIOR ART DOCUMENT

Patent Document

Patent Document 1: Japanese Laid-Open Patent Publication No. 2020-065032

The present disclosure provides a technique capable of adjusting a film quality with enhanced controllability while maintaining an in-plane distribution of a film thickness of a formed silicon nitride film.

SUMMARY

A film forming method according to an aspect of the present disclosure includes: a supply operation of supplying a processing gas into a processing container in which a substrate is accommodated, the processing gas including a silicon-containing gas, a nitrogen-containing gas, and a diluent gas; and a film forming operation of plasmarizing the processing gas by supplying, into the processing container, power obtained by phase-controlling and superimposing first power with a first frequency in a VHF band and second power with a second frequency different from the first frequency in the VHF band, and forming a silicon nitride film on the substrate by the plasmarized processing gas.

According to the present disclosure, it is possible to adjust a film quality with enhanced controllability while maintaining an in-plane distribution of a film thickness of a formed silicon nitride film.

BRIEF DESCRIPTION OF DRAWINGS

FIG. 1 is a schematic cross-sectional view illustrating an example of a film forming apparatus according to an embodiment.

FIG. 4 is a diagram illustrating an example of a measurement result of a reflective index (RI) of the silicon nitride film formed on the substrate using the TVW RF power by the film forming method according to an embodiment.

FIG. 5 is a diagram illustrating an example of a relationship between a phase difference between RF power with a first frequency and RF power with a second frequency, which are superimposed as the TVW RF power, and the film formation rate.

FIG. 14 is a diagram illustrating an example of a measurement result of a refractive index of the silicon nitride film formed by the film forming method according to the Comparative Example 2.

DETAILED DESCRIPTION

Figure 2:
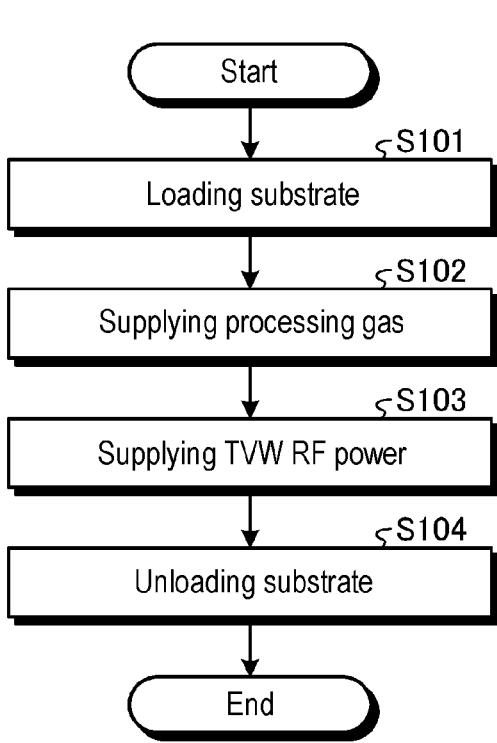
FIG. 2 is a flowchart illustrating an example of a flow of a film forming method according to an embodiment.

Hereinafter, various embodiments will be described in detail with reference to the drawings. In addition, the technology disclosed herein is not limited by the following embodiments.

With the miniaturization of semiconductor integrated circuits in recent years, there is a need to improve the uniformity of an in-plane distribution of a film thickness of a silicon nitride film to be formed on a substrate and to adjust a film quality to a desired film quality. In a process of forming the silicon nitride film, various processing parameters may be adjusted in order to improve the uniformity of the in-plane distribution of the film thickness.

The processing parameters to be adjusted to improve the uniformity of the in-plane distribution of the film thickness may include, for example, an internal pressure of a processing container, a flow rate of a processing gas to be supplied, a magnitude (value) of radio frequency power to be applied, and the like. However, it is known that when these processing parameters are adjusted to control the in-plane distribution of the film thickness, not only the in-plane distribution of the film thickness but also the film quality change. That is, since the in-plane distribution of the film thickness and the film quality are in a trade-off relationship, it is difficult to achieve both the uniformity of the in-plane distribution of the film thickness and the desired film quality. Hence, it is necessary to adjust the film quality with enhanced controllability while maintaining the in-plane distribution of the film thickness of the silicon nitride film to be formed.

[Configuration of Plasma Processing Apparatus]

Figure 1:
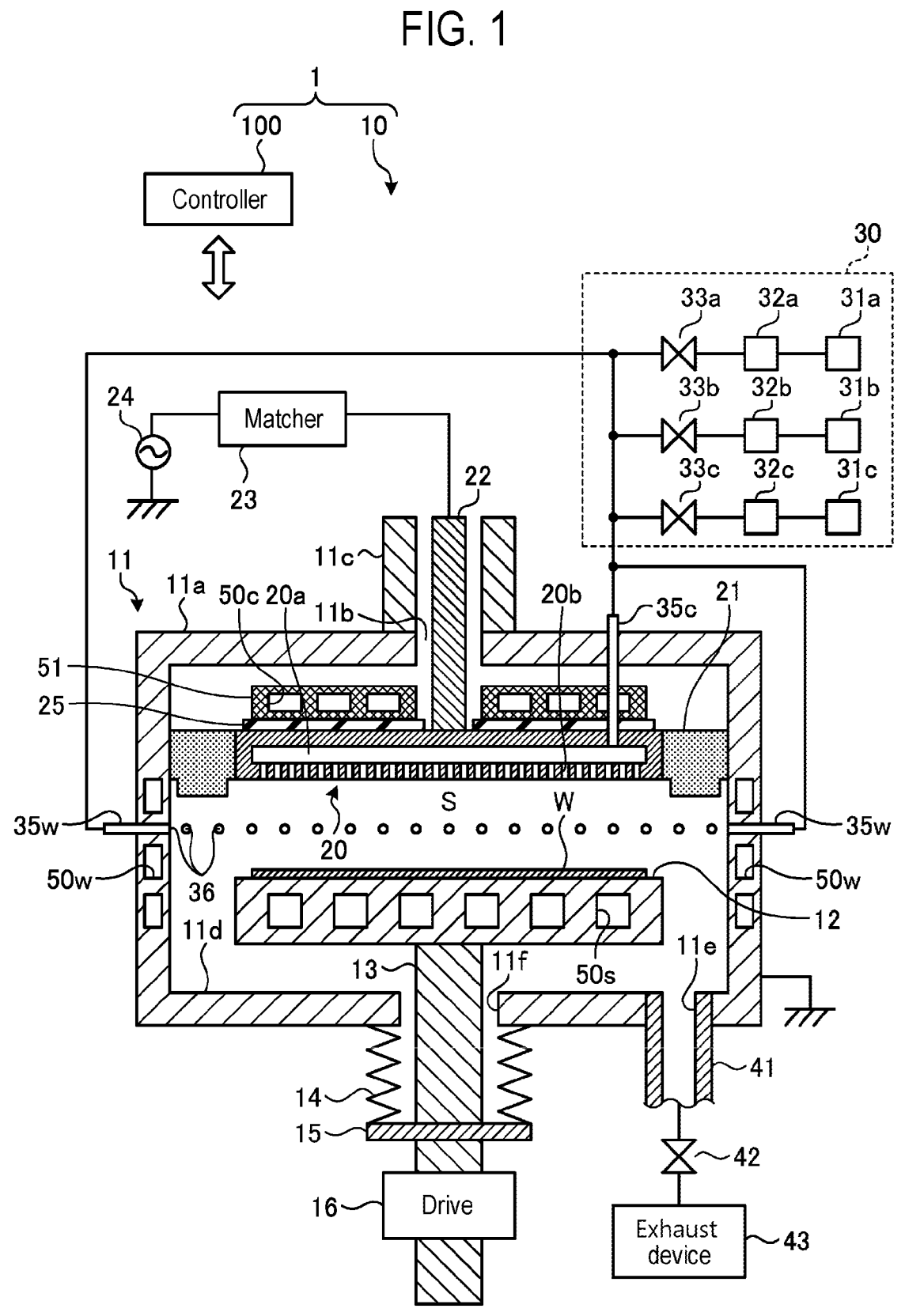

FIG. 1 is a schematic cross-sectional view illustrating an example of a film forming apparatus 1 according to an embodiment. The film forming apparatus 1 includes an apparatus main body 10 and a controller 100 that controls the apparatus main body 10. The apparatus main body 10 includes a substantially cylindrical processing container 11 in which a processing space S is formed. The processing container 11 is made of, for example, a metallic material such as aluminum. A surface of an inner wall of the processing container 11 is covered with a thermally sprayed coating made of a plasma-resistant material. The processing container 11 is grounded.

An opening 11b is provided in approximately the center of a ceiling wall 11a of the processing container 11. A cylindrical wall 11c is connected to an upper surface of the ceiling wall 11a so that an internal cavity of the cylindrical wall 11c communicates with the opening 11b.

A plurality of gas supply pipes 35w are provided on a sidewall of the processing container 11. Each gas supply pipe 35w communicates with the interior of the processing container 11 through an opening 36. A gas supplier 30 to be described later is connected to the plurality of gas supply pipes 35w. A gas supplied from the gas supplier 30 to each gas supply pipe 35w is supplied into the processing space S through the opening 36 of each gas supply pipe 35w.

A flow path 50w, through which a heat medium having a temperature adjusted by a temperature adjustment mechanism (not illustrated) is supplied in a circulation manner, is formed inside the sidewall of the processing container 11. A temperature of the sidewall of the processing container 11 may be controlled by circulating the heat medium having the adjusted temperature in the flow path 50w. In addition, alternatively, a member formed with a flow path, through which the heat medium having a temperature adjusted by the temperature adjustment mechanism (not illustrated) is supplied in a circulation manner, may be externally wound around the sidewall of the processing container 11. In this case, the flow path 50w may not be formed inside the sidewall of the processing container 11. The temperature of the heat medium is controlled by the controller 100.

An opening 11e is formed in a bottom wall 11d of the processing container 11. An auto pressure controller (APC) valve 42 and an exhaust device 43 are connected to the opening 11e via an exhaust pipe 41. The exhaust device 43 includes a vacuum pump, or the like, and discharges a gas inside the processing container 11. The APC valve 42 adjusts a pressure of the gas in the processing container 11 to a predetermined pressure. The APC valve 42 and the exhaust device 43 are controlled by the controller 100.

A stage 12 on which the substrate W is placed is provided below the processing space S in the processing container 11. A flow path 50s, through which the heat medium having a temperature adjusted by the temperature adjustment mechanism (not illustrated) is supplied in a circulation manner, is formed inside the stage 12. A temperature of the substrate W placed on the stage 12 may be controlled by circulating the heat medium having the adjusted temperature in the flow path 50s. A temperature of the heat medium is controlled by the controller 100.

The stage 12 is supported by a support member 13 passing through an opening 1 if in the bottom wall 11d. The support member 13 is provided with a flange 15. The flange 15 is connected to the bottom wall 11d of the processing container 11 via a bellows 14. Further, the support member 13 is driven up and down by a drive 16. The stage 12 moves up and down by driving the support member 13 up and down. As the stage 12 moves up and down, a gap between the substrate W placed on the stage 12 and a shower head 20 to be described later is changed. The drive 16 is controlled by the controller 100.

The shower head 20, which is made of a metal such as, for example, aluminum, is provided above the processing space S in the processing container 11 so as to face the stage 12. The shower head 20 is supported on the sidewall of the processing container 11 with a dielectric window 21 interposed therebetween. A gas diffusion chamber 20a is formed inside the shower head 20. A gas supply pipe 35c is connected to the gas diffusion chamber 20a. A plurality of gas supply ports 20b are formed in a lower portion of the shower head 20, that is, in a portion of the shower head 20 on the side of the processing space S so as to communicate with the gas diffusion chamber 20a.

The gas supplier 30 is connected to the gas supply pipe 35c. A gas supplied from the gas supplier 30 to the gas supply pipe 35c diffuses in the gas diffusion chamber 20a and is supplied in the form of a shower into the processing space S through the plurality of gas supply ports 20b.

The gas supplier 30 includes a plurality of gas sources 31a to 31c, a plurality of flow rate controllers 32a to 32c, and a plurality of valves 33a to 33c. The gas source 31a is, for example, a source of a silicon-containing gas such as a silane-based gas. The gas source 31b is, for example, a source of a nitrogen-containing gas. The gas source 31c is, for example, a source of a noble gas. In the present embodiment, the gas source 31a supplies, for example, a monosilane gas, the gas source 31b supplies, for example, an ammonia gas, and the gas source 31c supplies, for example, a helium gas.

The flow rate controller 32a controls a flow rate of the gas supplied from the gas source 31a, and supplies the gas having the controlled flow rate to the gas supply pipe 35c and each gas supply pipe 35w through the valve 33a. The flow rate controller 32b controls a flow rate of the gas supplied from the gas source 31b, and supplies the gas having the controlled flow rate to the gas supply pipe 35c and each gas supply pipe 35w through the valve 33b. The flow rate controller 32c controls a flow rate of the gas supplied from the gas source 31c, and supplies the gas having the controlled flow rate to the gas supply pipe 35c and each gas supply pipe 35w through the valve 33c.

An antenna conductor 22 is connected to approximately the center of an upper surface of the shower head 20. The antenna conductor 22 is arranged so as to pass through the opening 11b of the ceiling wall 11a and a central axis of the cylindrical wall 11c. A radio frequency (RF) power supply 24 is electrically connected to the antenna conductor 22 via a matcher 23. The RF power supply 24 supplies, to the antenna conductor 22, tailored voltage waveform (TVW) RF power obtained by phase-controlling and superimposing electromagnetic waves (power) with a plurality of frequencies in a very high frequency (VHF) band. In the present embodiment, the RF power supply 24 supplies, to the antenna conductor 22, TVW RF power obtained by phase-controlling and superimposing RF power with a "first frequency" in the VHF band and RF power with a "second frequency" in the VHF band, the second frequency being different from the first frequency. The RF power supply 24 is an example of a power supplier.

The power supplied from the RF power supply 24 to the antenna conductor 22 is transmitted in order between an outer peripheral surface of the antenna conductor 22 and an inner peripheral surface of the cylindrical wall 11c, between the outer peripheral surface of the antenna conductor 22 and the opening 11b, and between a lower surface of the ceiling wall 11a and the upper surface of the shower head 20. Then, the power transmitted in order between the lower surface of the ceiling wall 11a and the upper surface of the shower head 20 is transmitted to the dielectric window 21. In other words, a waveguide that introduces TVW electromagnetic waves (power) into the apparatus main body 10 is configured between the outer peripheral surface of the antenna conductor 22 and the inner peripheral surface of the cylindrical wall 11c, between the outer peripheral surface of the antenna conductor 22 and the opening 11b, and between the lower surface of the ceiling wall 11a and the upper surface of the shower head 20. This waveguide may be filled with a dielectric material such as quartz so as to allow the electromagnetic waves to be easily transmitted therethrough.

The dielectric window 21 is provided so as to face the stage 12 with the processing space S interposed therebetween and to cover the outer peripheral surface of the shower head 20. The power transmitted to the dielectric window 21 is emitted into the processing space S from the lower surface of the dielectric window 21. In the present embodiment, a plurality of convex portions are provided on the lower surface of the dielectric window 21 so as to protrude in the direction of the stage 12, that is, downward.

A cooling jacket 51 is provided on the upper surface of the shower head 20 with an insulating member 25 interposed therebetween. A flow path 50c, through which the heat medium having a temperature adjusted by the temperature adjustment mechanism (not illustrated) is supplied in a circulation manner, is formed inside the cooling jacket 51. A temperature of the shower head 20 may be controlled by circulating the heat medium having the adjusted temperature in the flow path 50c. The temperature of the heat medium is controlled by the controller 100.

In the present embodiment, the temperature-controlled heat medium is supplied to each of the flow path 50w formed inside the sidewall of the processing container 11, the flow path 50s formed inside the stage 12, and the flow path 50c formed inside the cooling jacket 51 separately. Thus, the sidewall of the processing container 11, the shower head 20, and the substrate W may be controlled to have different temperatures, respectively.

The controller 100 includes a memory, a processor, and an input/output interface. Data such as recipes, programs, and the like are stored in the memory. The memory is, for example, a random access memory (RAM), a read only memory (ROM), a hard disk drive (HDD), a solid state drive (SSD), or the like. The processor controls each part of the apparatus main body 10 via the input/output interface based on the data such as recipes stored in the memory by executing the programs read from the memory. The processor is a central processing unit (CPU), a digital signal processor (DSP), or the like.

[Film Forming Method]

Next, a flow of a film forming method using the film forming apparatus 1 configured as described above will be described. FIG. 2 is a flowchart illustrating an example of the flow of the film forming method according to an embodiment.

First, the substrate W is loaded into the processing container 11 by a transfer device (not illustrated) and is placed on the stage 12 (step S101).

Subsequently, the controller 100 supplies the processing gas from the gas supplier 30 into the processing container 11 through the shower head 20 (step S102). Step S102 is an example of a supply operation. In step S102, the processing gas containing, for example, a monosilane gas, an ammonia gas, and a helium gas is supplied into the processing container 11. The helium gas is used as a diluent gas. Instead of the helium gas, an argon gas or a mixed gas of the helium gas and the argon gas may be used as the diluent gas.

Subsequently, the controller 100 supplies TVW RF power from the RF power supply 24 into the processing container 11 through the shower head 20, thereby plasmarizing the processing gas in the processing container 11 (step S103). Step S103 is an example of a film forming operation. The TVW RF power is generated by superimposing and phase-controlling electromagnetic waves (RF power) with different frequencies in the VHF band. Specifically, the controller 100 controls the RF power supply 24 to generate the TVW RF power by phase-controlling and superimposing the RF power with the "second frequency" in the VHF band with respect to the RF power with the "first frequency" in the VHF band. The second frequency may be lower than the first frequency, and more specifically equal to or less than half the first frequency. For example, the first frequency is 180 MHz and the second frequency is 90 MHz. Further, the phase may be any phase selected from the range of 0 degrees to 360 degrees. In step S103, the internal pressure of the processing container 11 is set to a pressure within the range of 400 mTorr or more and 1,000 mTorr or less. Further, in step S103, a magnitude of the RF power with the first frequency is set to a magnitude within the range of 1,500 W or more and 5,000 W or less. In addition, a magnitude of the RF power with the second frequency may be smaller than the magnitude of the RF power with the first frequency, and may be, for example, 500 W. A silicon nitride film is formed on the substrate W by the plasmarized processing gas.

After the silicon nitride film having a predetermined film thickness is formed on the substrate W, the supply of the RF power into the processing container 11 and the supply of the processing gas into the processing container 11 are stopped. Then, the substrate W is unloaded from the interior of the processing container 11 (step S104), and the processing ends. This is an example of the processing flow of the film forming method according to the embodiment.

[Significance of Using VHF Band]

As described above, in the film forming method according to the embodiment, the silicon nitride film is formed on the substrate W using the TVW RF power obtained by phase-controlling and superimposing the RF power with the first frequency in the VHF band and the RF power with the second frequency in the VHF band, the second frequency being different from the first frequency. Here, when a frequency band other than the VHF band is used, the following disadvantages may be caused. For example, at a frequency (for example, 13.56 MHz) in the high frequency (HF) band lower than the VHF band, it is difficult to increase the density of the silicon nitride film, compared to high frequencies such as the microwave band and the VHF band. In addition, it is known that the film density may be increased as more heat energy is applied. However, at frequencies in the HF band, it is difficult to increase the density of the silicon nitride film at low temperatures (for example, 400 degrees C. or lower). Further, at frequencies in the HF band, it is easier to control the uniformity of the film thickness, but charge-up damage (CUD) of the substrate is more likely to occur, compared to high frequencies such as the microwave band and the VHF band. Further, at frequencies in the HF band, the energy of ions contained in the plasma is increased, and damage to the substrate by the ions increases, compared to high frequencies such as the microwave band and the VHF band.

On the other hand, when film formation is performed using power with frequencies in the microwave (for example, 2.45 GHz) band higher than the VHF band, it is possible to increase the density of the film even at low temperatures. However, since radio waves with frequencies in the microwave band have a shorter wavelength than radio waves in the VHF band, the wavelength of standing waves formed near the substrate W is also shortened. Therefore, the unevenness of plasma formed along the standing waves tends to deteriorate the uniformity of the film. Further, it is conceivable to improve the uniformity by optimizing hardware such as a slot antenna, but this requires a dedicated design, which increases the apparatus cost.

Hence, in the film forming method according to the embodiment, by performing film formation using TVW RF power obtained by phase-controlling and superimposing RF power with a plurality of frequencies in the VHF band, the increased density of a silicon nitride film to be formed is achieved and damage to the substrate W is reduced.

[Evaluation of Silicon Nitride Film Formed Using TVW RF Power]

Figure 3:
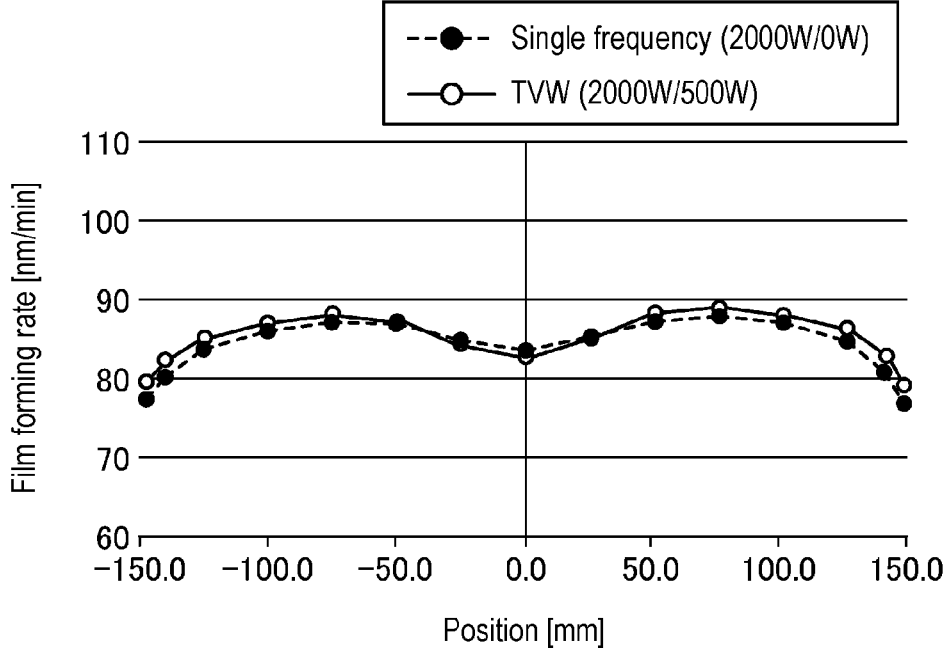
FIG. 3 is a diagram illustrating an example of a measurement result of a film formation rate of a silicon nitride film formed on a substrate using TVW RF power by the film forming method according to an embodiment.

Here, the in-plane distribution of the film thickness and the film quality of the silicon nitride film formed by the film forming method according to the embodiment were evaluated. FIG. 3 is a diagram illustrating an example of a measurement result of a film formation rate of the silicon nitride film formed on the substrate W using TVW RF power by the film forming method according to the embodiment. FIG. 3 also illustrates a measurement result of a film formation rate of a silicon nitride film formed on the substrate W using RF power with a single frequency. FIG. 4 is a diagram illustrating an example of a measurement result of a refractive index (RI) of the silicon nitride film formed on the substrate W using TVW RF power by the film forming method according to the embodiment. FIG. 4 also illustrates a measurement result of a refractive index of a silicon nitride film formed on the substrate W using RF power with a single frequency. The horizontal axis in FIGS. 3 and 4 is the in-plane radial position of the substrate W, the center (0 mm) of the horizontal axis corresponds to the central portion of the substrate W, and the left and right ends (±150.0 mm) of the horizontal axis correspond to the edge portions of the substrate W. The silicon nitride films each having the film formation rate and the refractive index illustrated in FIGS. 3 and 4 were formed mainly under the following conditions.

(Silicon Nitride Film Formed Using TVW RF Rower)
  Internal pressure of processing container 11: 600 mTorr
  Processing gas: monosilane gas, ammonia gas, and helium gas
  Frequency of TVW RF power: first frequency/second frequency=180 MHz/90 MHz
  Phase control of TVW RF power: 0 degrees Magnitude of TVW RF power: RF power with the first frequency/RF power with the second frequency=2,000 W/500 W (Silicon Nitride Film Formed Using RF Power with Single Frequency)
  Internal pressure of processing container 11: 600 mTorr
  Processing gas: monosilane gas, ammonia gas, and helium gas
  Frequency of RF power with single frequency: 180 MHz
  Magnitude of RF power with single frequency: 2,000 W As can be seen from FIG. 3, in the case of using the TVW RF power, the in-plane distribution of the film formation rate equivalent to that in the case of using the RF power with the single frequency was obtained. On the other hand, as can be seen from FIG. 4, in the case of using the TVW RF power, the refractive index greater than that in the case of using the RF power with the single frequency was obtained. It can be seen from the measurement results illustrated in FIGS. 3 and 4 that the refractive index as an example of the film quality may be adjusted while maintaining the in-plane distribution of the film thickness of the silicon nitride film to be formed by using the TVW RF power obtained by superimposing the RF power with the plurality of frequencies in the VHF band.

[Adjustment of Film Quality by Phase Control of TVW RF Power]

Figure 6:
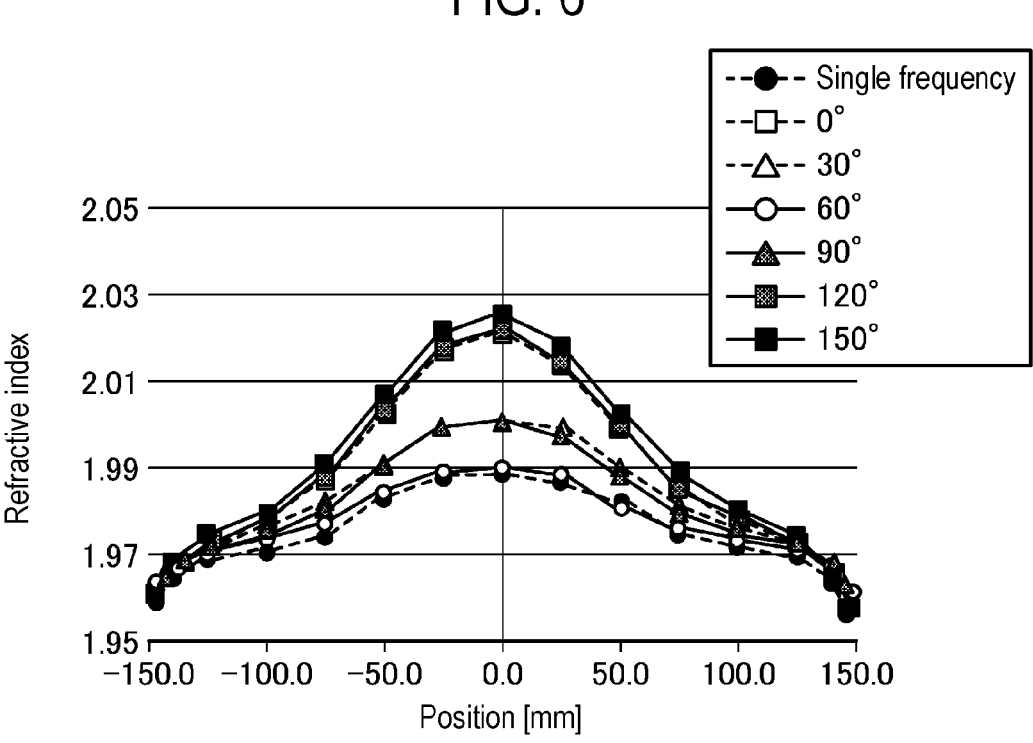
FIG. 6 is a diagram illustrating an example of a relationship between the phase difference between the RF power with the first frequency and the RF power with the second frequency, which are superimposed as the TVW RF power, and a refractive index.

Subsequently, evaluation was made on how the in-plane distribution of the film thickness and the film quality of a silicon nitride film to be formed change by changing the phases of RF power with the first frequency and RF power with the second frequency which are superimposed as TVW RF power. FIG. 5 is a diagram illustrating an example of a relationship between a phase difference between the RF power with the first frequency and the RF power with the second frequency, which are superimposed as TVW RF power, and the film formation rate. FIG. 6 is a diagram illustrating an example of a relationship between the phase difference between the RF power with the first frequency and the RF power with the second frequency, which are superimposed as TVW RF power, and the refractive index. The horizontal axis in FIGS. 5 and 6 is the in-plane radial position of the substrate W, the center (0 mm) of the horizontal axis corresponds to the central portion of the substrate W, and the left and right ends (±150.0 mm) of the horizontal axis correspond to the edge portions of the substrate W. FIGS. 5 and 6 respectively illustrate the measurement results of measuring the film formation rate and the refractive index of a silicon nitride film to be formed by changing the phase difference between the RF power with the first frequency and the RF power with the second frequency which are superimposed as TVW RF power. In the measurements of FIGS. 5 and 6, the phase difference between the RF power with the first frequency and the RF power with the second frequency, which are superimposed as TVW RF power, was set to six types of 0 degrees, 30 degrees, 60 degrees, 90 degrees, 120 degrees, and 150 degrees. Further, FIGS. 5 and 6 also illustrate the measurement result of the film formation rate and the measurement result of the refractive index of a silicon nitride film formed on the substrate W using RF power with a single frequency, respectively. In addition, conditions other than the phase difference used for the evaluation of FIGS. 5 and 6 are the same as those used for the evaluation of FIGS. 3 and 4.

As can be seen from FIG. 5, the in-plane distribution of the film formation rate of the silicon nitride film formed when changing the phase difference between the RF power with the first frequency and the RF power with the second frequency which are superimposed as TVW RF power was equivalent to that in the case of using the RF power with the single frequency. On the other hand, as can be seen from FIG. 6, it was possible to change the refractive index into a plurality of patterns by changing the phase difference between the RF power with the first frequency and the RF power with the second frequency which are superimposed as TVW RF power. It can be seen from the measurement results illustrated in FIGS. 5 and 6 that the refractive index, which is an example of the film quality, may be adjusted with enhanced controllability while maintaining the in-plane distribution of the film thickness of the silicon nitride film to be formed by changing the phase difference by the phase control of TVW RF power.

[Adjustment of Stress by Phase Control of TVW RF Power]

Figure 7:
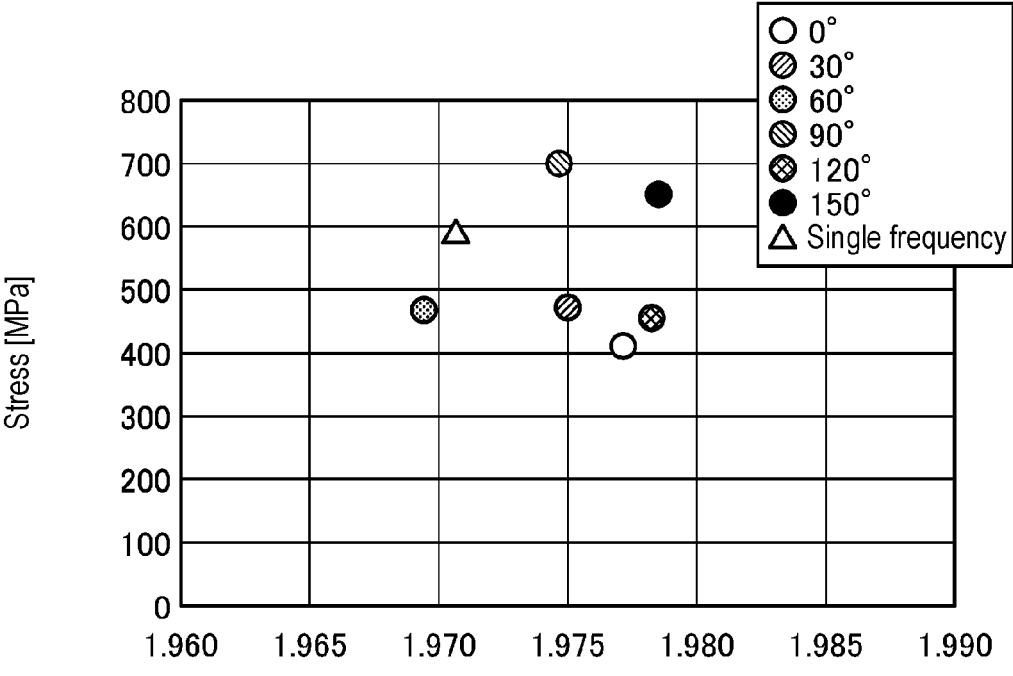
FIG. 7 is a diagram illustrating an example of a relationship between the phase difference between the RF power with the first frequency and the RF power with the second frequency, which are superimposed as the TVW RF power, and a stress.

Subsequently, evaluation was made on how stress of a silicon nitride film to be formed changes by changing the phases of RF power with the first frequency and RF power with the second frequency which are superimposed as TVW RF power. FIG. 7 is a diagram illustrating an example of a relationship between the phase difference between RF power with the first frequency and RF power with the second frequency, which are superimposed as TVW RF power, and the stress. FIG. 7 illustrates the measurement result of measuring the stress of a silicon nitride film to be formed by changing the phase difference between RF power with the first frequency and RF power with the second frequency which are superimposed as TVW RF power. In the measurement of FIG. 7, the phase difference between RF power with the first frequency and RF power with the second frequency which are superimposed as TVW RF power was set to six types of 0 degrees, 30 degrees, 60 degrees, 90 degrees, 120 degrees, and 150 degrees. Further, FIG. 7 also illustrates the measurement result of the stress of a silicon nitride film formed on the substrate W using RF power with a single frequency. In the vertical axis of FIG. 7, a positive direction indicates that the stress of the film is tensile, and a negative direction indicates that the stress of the film is compressive. The horizontal axis in FIG. 7 indicates the average value of the refractive index in the in-plane radial direction of the substrate W.

As can be seen from FIG. 7, a plurality of different stresses were obtained by changing the phase difference between RF power with the first frequency and RF power with the second frequency which are superimposed as TVW RF power. For example, the stress of the silicon nitride film to be formed when the phase difference was other than 90 degrees and 150 degrees was compressive compared to the case of using the single frequency. On the other hand, the stress of the silicon nitride film to be formed when the phase difference was 90 degrees or 150 degrees was tensile compared to the case of using the single frequency. It can be seen from the measurement result of FIG. 7 that the stress, which is an example of the film quality, may be adjusted with enhanced controllability by changing the phase difference by the phase control of TVW RF power.

Figure 8:
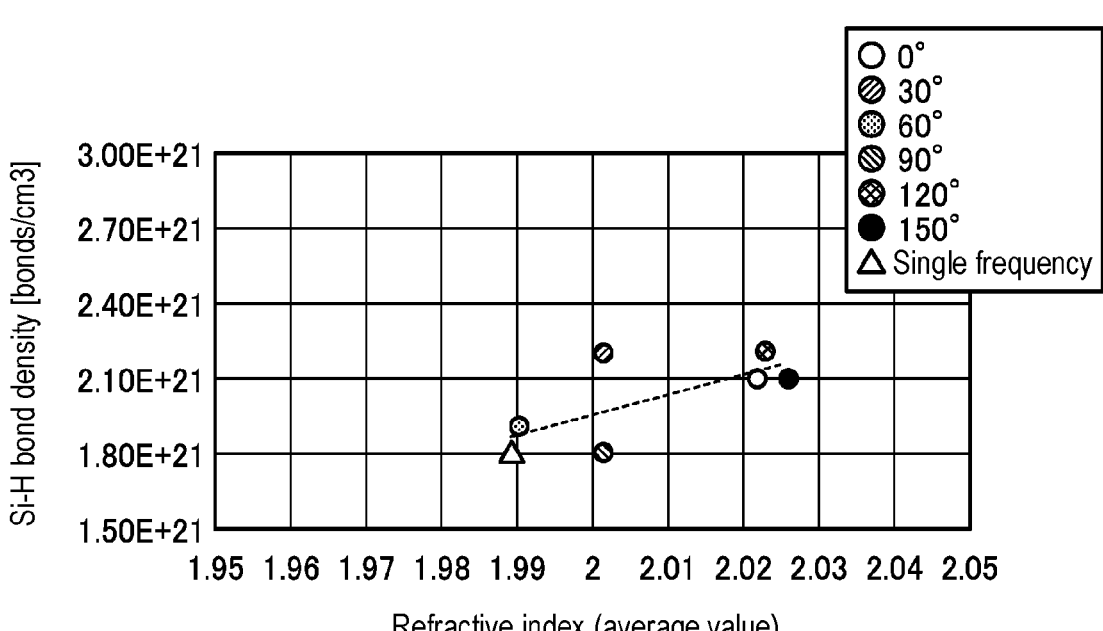
FIG. 8 is a diagram illustrating an example of a relationship between the phase difference between the RF power with the first frequency and the RF power with the second frequency, which are superimposed as the TVW RF power, and a Si—H bond density.

FIG. 8 is a diagram illustrating an example of a relationship between the phase difference between RF power with the first frequency and RF power with the second frequency, which are superimposed as TVW RF power, and a Si—H bond density.

As can be seen from FIG. 8, the Si—H bond density in a silicon nitride film to be formed when the phase difference was 90 degrees was reduced compared to the case of using the phase difference other than 90 degrees. It was confirmed from the measurement results of FIGS. 7 and 8 that a reduction in the Si—H bond density of the silicon nitride film was a factor in increasing the tensility of the stress of the silicon nitride film to be formed when the phase difference was 90 degrees.

[Range of Magnitude of RF Power with First Frequency]

Figure 9:
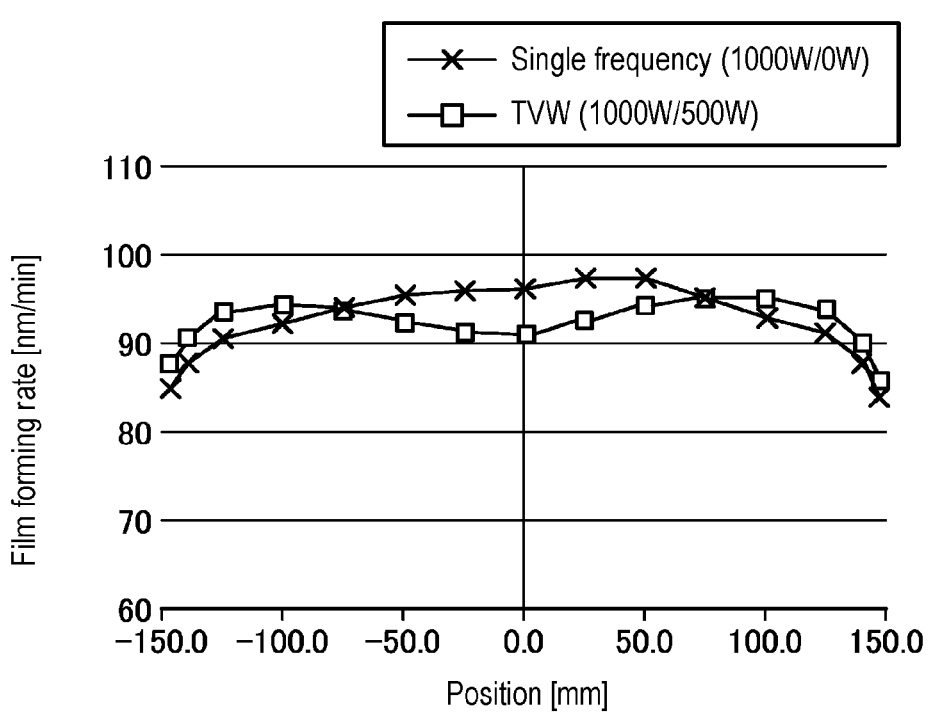
FIG. 9 is a diagram illustrating an example of a measurement result of a film formation rate of a silicon nitride film formed by a film forming method according to Comparative Example 1.
Figure 10:
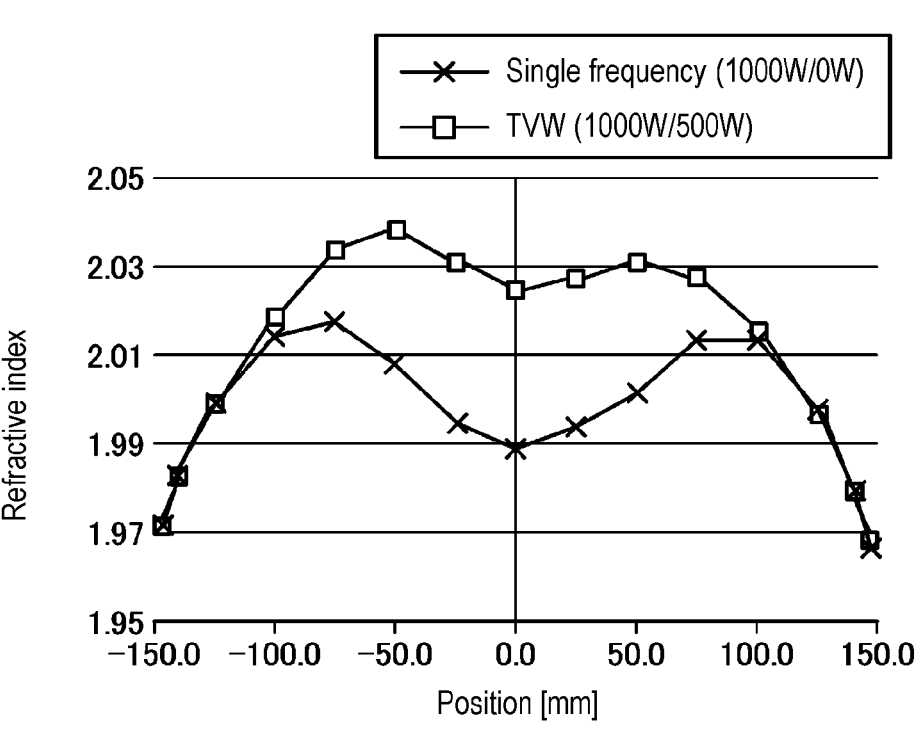
FIG. 10 is a diagram illustrating an example of a measurement result of a refractive index of the silicon nitride film formed by the film forming method according to the Comparative Example 1.

Subsequently, the effectiveness of the range of the magnitude of RF power with the first frequency was evaluated. FIG. 9 is a diagram illustrating an example of a measurement result of a film formation rate of a silicon nitride film formed by a film forming method according to Comparative Example 1. FIG. 10 is a diagram illustrating an example of a measurement result of a refractive index of the silicon nitride film formed by the film forming method according to Comparative Example 1. FIGS. 9 and 10 illustrate the film formation rate and the film density of the silicon nitride film formed when the magnitude of TVW RF power and the magnitude of RF power with a single frequency were changed to 1,000 W/500 W and 1,000 W under the film forming conditions of FIGS. 3 and 4.

Figure 11:
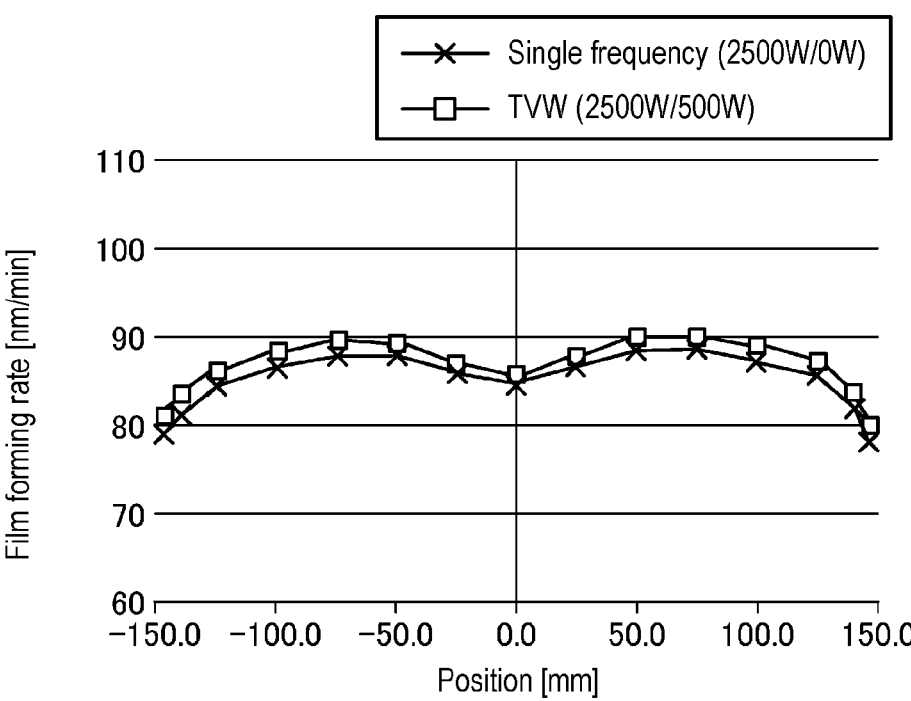
FIG. 11 is a diagram illustrating an example of a measurement result of a film formation rate of a silicon nitride film formed on a substrate W using TVW RF power by a film forming method according to Example 1.
Figure 12:
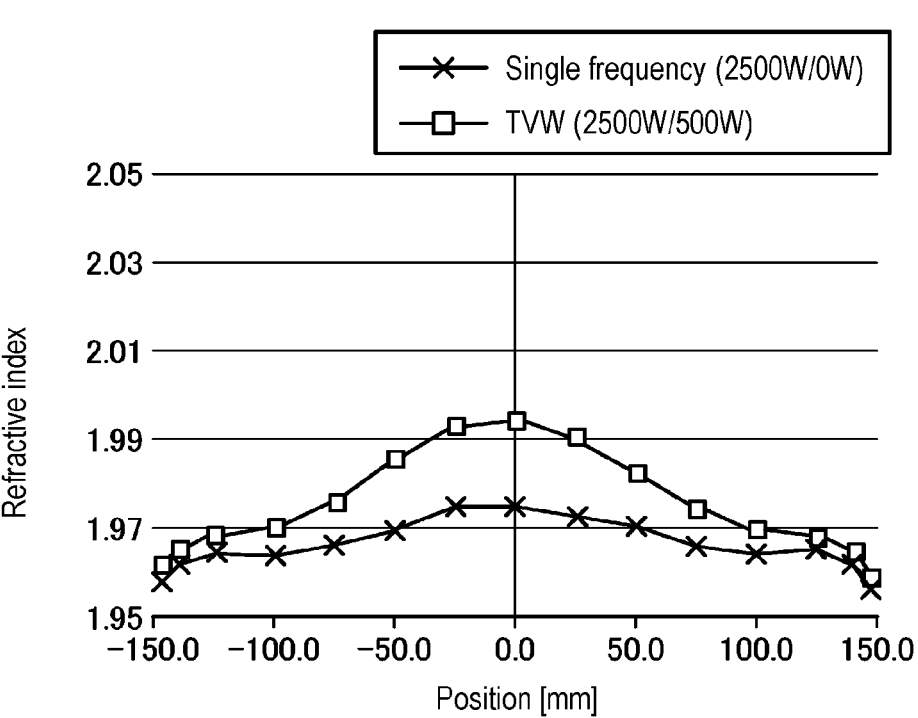
FIG. 12 is a diagram illustrating an example of a measurement result of a refractive index of the silicon nitride film formed on the substrate W using the TVW RF power by the film forming method according to the Example 1.

FIG. 11 is a diagram illustrating an example of a measurement result of a film formation rate of a silicon nitride film formed on the substrate W using TVW RF power by a film forming method according to Example 1. FIG. 12 is a diagram illustrating an example of a measurement result of a refractive index of the silicon nitride film formed on the substrate W using TVW RF power by the film forming method according to Example 1. FIGS. 11 and 12 illustrate the film formation rate and the refractive index of the silicon nitride film formed when the magnitude of TVW RF power and the magnitude of RF power with a single frequency were changed to 2,500 W/500 W and 2,500 W under the film forming conditions of FIGS. 3 and 4.

The horizontal axis in FIGS. 9 to 12 is the in-plane radial position of the substrate W, the center (0 mm) of the horizontal axis corresponds to a central portion of the substrate W, and the left and right ends (±150.0 mm) of the horizontal axis correspond to edge portions of the substrate W. Further, FIGS. 9 and 11 also illustrate a measurement result of a film formation rate of a silicon nitride film formed on the substrate W using RF power with a single frequency, respectively. Further, FIGS. 10 and 12 also illustrate a measurement result of a refractive index of the silicon nitride film formed on the substrate W using RF power with the single frequency, respectively.

As can be seen from FIG. 9, when the magnitude of TVW RF power is 1,000 W/500 W, the in-plane distribution of the film formation rate was changed compared to the case of using RF power with the single frequency. On the other hand, as can be seen from FIG. 10, when the magnitude of TVW RF power is 1,000 W/500 W, the refractive index was changed compared to the case of using RF power with the single frequency.

Further, as can be seen from FIG. 11, when the magnitude of TVW RF power is 2,500 W/500 W, the in-plane distribution of the film formation rate equivalent to that in the case of using RF power with the single frequency was obtained. On the other hand, as can be seen from FIG. 12, when the magnitude of TVW RF power is 2,500 W/500 W, a refractive index greater than that in the case of using RF power with the single frequency was obtained.

As described above, from the measurement results of FIGS. 3, 4 and 9 to 12, it is estimated that the refractive index may be adjusted with enhanced controllability while maintaining the in-plane distribution of the film thickness of the silicon nitride film to be formed by setting the magnitude of RF power with the first frequency to a value greater than 1,000 W. Accordingly, from the viewpoint of adjusting the refractive index with enhanced controllability while maintaining the in-plane distribution of the film thickness of the silicon nitride film to be formed, the magnitude of RF power with the first frequency may be set to, for example, a magnitude within the range of 1,500 W or more and 5,000 W or less. Further, from the viewpoint of adjusting the refractive index with enhanced controllability while maintaining the in-plane distribution of the film thickness of the silicon nitride film to be formed, the magnitude of RF power with the first frequency may be set to, for example, a magnitude within the range of 2,000 W or more and 3,000 W or less.

[Range of Pressure]

Figure 13:
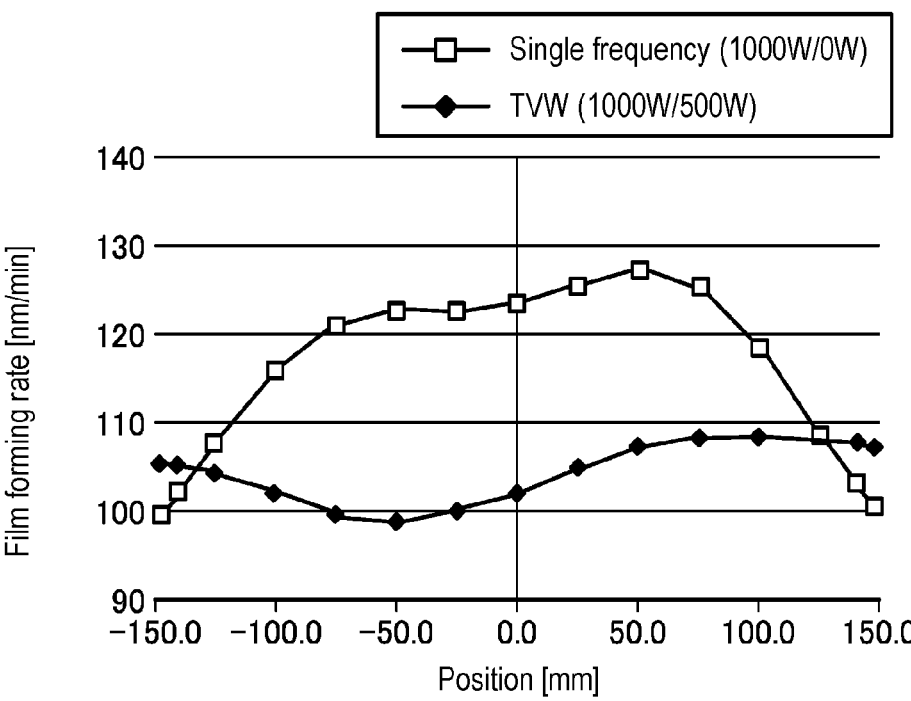
FIG. 13 is a diagram illustrating an example of a measurement result of a film formation rate of a silicon nitride film formed by a film forming method according to Comparative Example 2.
Figure 14:
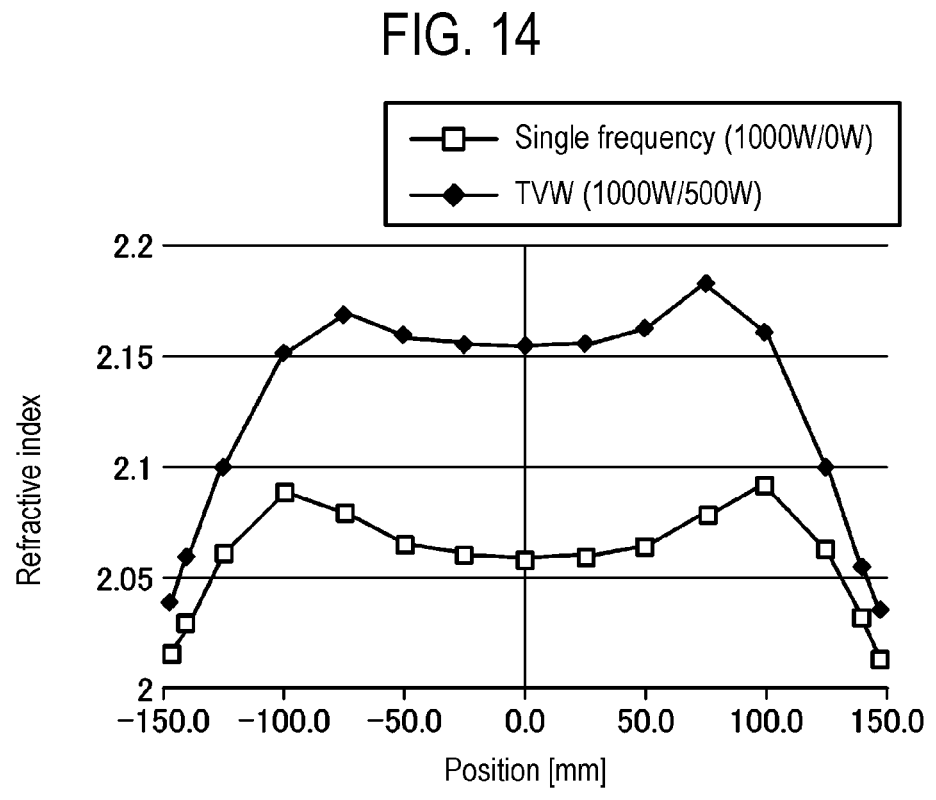

Subsequently, the effectiveness of the range of the internal pressure of the processing container 11 was evaluated. FIG. 13 is a diagram illustrating an example of a measurement result of a film formation rate of a silicon nitride film formed by a film forming method according to Comparative Example 2. FIG. 14 is a diagram illustrating an example of a measurement result of a refractive index of the silicon nitride film formed by the film forming method according to Comparative Example 2. FIGS. 13 and 14 illustrate the film formation rate and the refractive index of the silicon nitride film formed when the internal pressure of the processing container 11 was changed to 120 mTorr under the film forming conditions of FIGS. 3 and 4.

The horizontal axis in FIGS. 13 and 14 is the in-plane radial position of the substrate W, the center (0 mm) of the horizontal axis corresponds to a central portion of the substrate W, and the left and right ends (±150.0 mm) of the horizontal axis correspond to edge portions of the substrate W. FIG. 13 also illustrates a measurement result of a film formation rate of a silicon nitride film formed on the substrate W using RF power with a single frequency. Further, FIG. 14 also illustrates a measurement result of a refractive index of the silicon nitride film formed on the substrate W using RF power with the single frequency.

As can be seen from FIG. 13, when the internal pressure of the processing container 11 is 120 mTorr, the in-plane distribution of the film formation rate was changed compared to the case of using RF power with the single frequency. On the other hand, as can be seen from FIG. 14, when the internal pressure of the processing container 11 is 120 mTorr, the refractive index was changed compared to the case of using RF power with the single frequency.

As described above, from the measurement results of FIGS. 3, 4, 13 and 14, it is estimated that the refractive index may be adjusted with enhanced controllability while maintaining the in-plane distribution of the film thickness of the silicon nitride film to be formed by setting the internal pressure of the processing container 11 to a value greater than 120 mTorr. Accordingly, from the viewpoint of adjusting the refractive index with enhanced controllability while maintaining the in-plane distribution of the film thickness of the silicon nitride film to be formed, the internal pressure of the processing container 11 may be set to a pressure within the range of 400 mTorr or more and 1,000 mTorr or less.

[Mechanism Enabling Only Film Quality to be Adjusted by Phase Control of TVW RF Power]

It is considered that the phase control of TVW RF power caused a deviation in the self-bias of an electrode to change the thickness of a plasma sheath, and as a result, the transmission of electromagnetic waves changed. Further, it is considered that ion energy changed as the thickness of the plasma sheath changed, and the film quality (refractive index or stress) changed accordingly.

Effects of Embodiment

As described above, the film forming method according to the embodiment includes: a supply operation of supplying a processing gas into a processing container in which a substrate is accommodated, the processing gas containing a silicon-containing gas, a nitrogen-containing gas, and a diluent gas; and a film forming operation of plasmarizing the processing gas by supplying, into the processing container, power (TVW RF power) obtained by phase-controlling and superimposing power with a first frequency in a VHF band and power with a second frequency different from the first frequency in the VHF band, and forming a silicon nitride film on the substrate by the plasmarized processing gas. Thus, the film quality (refractive index and stress) may be adjusted with enhanced controllability while maintaining the in-plane distribution of the film thickness of the silicon nitride film to be formed.

Further, the second frequency may be a frequency lower than the first frequency. The second frequency may be equal to or less than half the first frequency. For example, the first frequency may be 180 MHz, and the second frequency may be 90 MHz. Thus, the film quality may be adjusted with enhanced controllability by adjusting the combination of frequencies superimposed as TVW RF power.

Further, in the film forming operation, the internal pressure of the processing container may be to a pressure within a range of 400 mTorr or more and 1,000 mTorr or less. Thus, when forming the silicon nitride film using TVW RF power, the film quality may be adjusted with enhanced controllability while maintaining the in-plane distribution of the film thickness by adjusting the internal pressure of the processing container.

Further, in the film forming operation, the magnitude of the power (RF power) with the first frequency may be set to a magnitude within the range of 1,500 W or more and 5,000 W or less. Thus, when forming the silicon nitride film using TVW RF power, the film quality may be adjusted with enhanced controllability while maintaining the in-plane distribution of the film thickness by adjusting the magnitude of power (RF power) with the first frequency.

It should be noted that the embodiments disclosed herein are exemplary in all respects and are not restrictive. The above-described embodiments may be omitted, replaced or modified in various forms without departing from the scope and spirit of the appended claims.

For example, in the above-described embodiments, although the case where film formation is performed using TVW RF power obtained by phase-controlling and superimposing RF power with two different frequencies in the VHF band has been described as an example, the disclosed technique is not limited thereto. The film formation may be performed using TVW RF power obtained by phase-controlling and superimposing RF power with three or more different frequencies in the VHF band.

EXPLANATION OF REFERENCE NUMERALS

S: processing space, W: substrate, 1: film forming apparatus, 10: apparatus main body, 11: processing container, 11*a*: ceiling wall, 11*b*: opening, 11*c*: cylindrical wall, 11*d*: bottom wall, 11*e*: opening, 11*f*: opening, 12: stage, 13: support member, 14: bellows, 15: flange, 16: drive, 20: shower head, 20*a*: gas diffusion chamber, 20*b*: gas supply port, 21: dielectric window, 22: antenna conductor, 23: matcher, 24: RF power supply, 25: insulating member, 30: gas supplier, 31*a* to 31*c*: gas source, 32*a* to 32*c*: flow rate controller, 33*a* to 33*c*: valve, 35*c*: gas supply pipe, 35*w*: gas supply pipe, 36: opening, 41: exhaust pipe, 42: APC valve, 43: exhaust device, 50*c*: flow path, 50*s*: flow path, 50*w*: flow path, 51: cooling jacket, 100: controller

What is claimed is:

1. A film forming method comprising:

a supply operation of supplying a processing gas into a processing container in which a substrate is accommodated, the processing gas including a silicon-containing gas, a nitrogen-containing gas, and a diluent gas; and a film forming operation of plasmarizing the processing gas by supplying, into the processing container, power obtained by phase-controlling and superimposing first power with a first frequency in a VHF band and second power with a second frequency different from the first frequency in the VHF band, and forming a silicon nitride film on the substrate by the plasmarized processing gas, wherein the phase-controlling and superimposing the first power and the second power includes controlling a difference in phase between the first power and the second power according to film quality of the silicon nitride film, before superimposing the first power and the second power.

2. The film forming method of claim 1, wherein the second frequency is lower than the first frequency.

3. The film forming method of claim 2, wherein the second frequency is equal to or less than half the first frequency.

4. The film forming method of claim 3, wherein the first frequency is 180 MHz and the second frequency is 90 MHz.

5. The film forming method of claim 4, wherein in the film forming operation, an internal pressure of the processing container is set in a range of 400 mTorr or more and 1,000 mTorr or less.

6. The film forming method of claim 5, wherein in the film forming operation, a magnitude of the first power with the first frequency is set in a range of 1,500 W or more and 5,000 W or less.

7. The film forming method of claim 1, wherein the second frequency is equal to or less than half the first frequency.

8. The film forming method of claim 1, wherein the first frequency is 180 MHz and the second frequency is 90 MHz.

9. The film forming method of claim 1, wherein in the film forming operation, an internal pressure of the processing container is set in a range of 400 mTorr or more and 1,000 mTorr or less.

10. The film forming method of claim 1, wherein in the film forming operation, a magnitude of the first power with the first frequency is set in a range of 1,500 W or more and 5,000 W or less.

11. The film forming method of claim 1, wherein the film quality of the silicon nitride film includes at least one of a refractive index of the silicon nitride film or a stress of the silicon nitride film.

12. A film forming apparatus comprising:

a processing container in which a substrate is accommodated;

a gas supplier configured to supply a processing gas into the processing container;

a power supplier configured to supply power into the processing container; and a controller, wherein the controller controls the gas supplier and the power supplier to execute a film forming method including:

a supply operation of supplying the processing gas into the processing container in which the substrate is accommodated, the processing gas including a silicon-containing gas, a nitrogen-containing gas, and a diluent gas; and a film forming operation of plasmarizing the processing gas by supplying, into the processing container, the power obtained by phase-controlling and superimposing first power with a first frequency in a VHF band and second power with a second frequency different from the first frequency in the VHF band, and forming a silicon nitride film on the substrate by the plasmarized processing gas, wherein the phase-controlling and superimposing the first power and the second power includes controlling a difference in phase between the first power and the second power according to film quality of the silicon nitride film, before superimposing the first power and the second power.

13. The film forming method of claim 12, wherein the film quality of the silicon nitride film includes at least one of a refractive index of the silicon nitride film or a stress of the silicon nitride film.

* * * * *